United States Patent
Han et al.

(10) Patent No.: US 9,747,230 B2
(45) Date of Patent: Aug. 29, 2017

(54) MEMORY RANK AND ODT CONFIGURATION IN A MEMORY SYSTEM

(71) Applicant: Rambus Inc., Sunnyvale, CA (US)

(72) Inventors: Minghui Han, San Jose, CA (US); Amir Amirkhany, Sunnyvale, CA (US); Ravindranath Kollipara, Palo Alto, CA (US); Ralf Michael Schmitt, Mountain View, CA (US)

(73) Assignee: Rambus Inc., Sunnyvale, CA (US)

( * ) Notice: Subject to any disclaimer, the term of this patent is extended or adjusted under 35 U.S.C. 154(b) by 285 days.

(21) Appl. No.: 14/408,955

(22) PCT Filed: Oct. 14, 2013

(86) PCT No.: PCT/US2013/064781
§ 371 (c)(1),
(2) Date: Dec. 17, 2014

(87) PCT Pub. No.: WO2014/062543
PCT Pub. Date: Apr. 24, 2014

(65) Prior Publication Data
US 2015/0331817 A1    Nov. 19, 2015

Related U.S. Application Data

(60) Provisional application No. 61/714,168, filed on Oct. 15, 2012.

(51) Int. Cl.
*G06F 13/36* (2006.01)
*G06F 13/28* (2006.01)
(Continued)

(52) U.S. Cl.
CPC ............ *G06F 13/28* (2013.01); *G06F 3/0611* (2013.01); *G06F 3/0635* (2013.01);
(Continued)

(58) Field of Classification Search
None
See application file for complete search history.

(56) References Cited

U.S. PATENT DOCUMENTS 7,149,841 B2    12/2006  LaBerge
7,372,293 B2     5/2008  Cox et al.
(Continued)

OTHER PUBLICATIONS

PCT International Search Report and Written Opinion, PCT/US2013/064781, May 1, 2014, 13 Pages.
(Continued)

*Primary Examiner* — Elias Mamo
(74) *Attorney, Agent, or Firm* — Fenwick & West LLP

(57) ABSTRACT

A memory system includes a two memory modules and a memory controller. The memory modules each include at least a first memory package corresponding to a first number of memory ranks (e.g. one memory rank) and a second memory package corresponding to a second number of memory ranks (e.g. two memory ranks) that is greater than the first number of memory ranks. For each module, the memory packages may be asymmetrically staggered such that one memory package is further from the memory controller than the other memory package. The memory controller is coupled to the memory packages of both modules via a common data line and generates control information for controlling the on-die termination (ODT) of the memory packages.

17 Claims, 6 Drawing Sheets

(51) Int. Cl.
*G06F 3/06* (2006.01)
*G11C 5/04* (2006.01)
*G11C 5/06* (2006.01)
*G11C 7/10* (2006.01)

(52) U.S. Cl.
CPC .............. *G06F 3/0683* (2013.01); *G11C 5/04* (2013.01); *G11C 5/063* (2013.01); *G11C 7/1084* (2013.01)

(56) References Cited

U.S. PATENT DOCUMENTS

| | | | |
|---|---|---|---|
| 7,984,355 B2* | 7/2011 | Djordjevic | G06F 11/1044 365/221 |
| 8,064,236 B2 | 11/2011 | Nishio et al. | |
| 8,250,295 B2* | 8/2012 | Amidi | G11C 5/04 365/230.03 |
| 2009/0016124 A1* | 1/2009 | Kim | G11C 7/1078 365/194 |
| 2010/0138598 A1 | 6/2010 | LaBerge | |
| 2011/0316580 A1* | 12/2011 | McCall | G11C 7/1045 326/30 |
| 2012/0113733 A1* | 5/2012 | Kim | G11O 5/063 365/193 |
| 2012/0272013 A1 | 10/2012 | Liou | |
| 2013/0031326 A1* | 1/2013 | Grunzke | G11O 5/04 711/167 |
| 2014/0055162 A1* | 2/2014 | Jung | H03K 19/017545 326/30 |
| 2016/0028395 A1* | 1/2016 | Bains | H03K 19/0005 326/30 |

OTHER PUBLICATIONS

PCT International Preliminary Report on Patentability dated Apr. 30, 2015 (Chapter I) in International Application No. PCT/US2013/064781. 8 pages.

PCT International Search Report dated May 1, 2014 in International Application No. PCT/US2013/064781. 13 pages.

* cited by examiner

| | ODT of DIMMA, Group A (single rank) | ODT of DIMMA, Group B (dual rank) | ODT of DIMMB, Group A (single rank) | ODT of DIMMB, Group B (dual rank) |
|---|---|---|---|---|
| WRITE to DIMMA, Group A (single rank) | No term | 45 ohm | 25 ohm | No term |
| WRITE to DIMMA, Group B (dual rank) | 45 ohm | No term | 25 ohm | No term |
| WRITE to DIMMB, Group A (single rank) | 25 ohm | No term | no term | 45 ohm |
| WRITE to DIMMB, Group B (dual rank) | 25 ohm | No term | 45 ohm | No term |
| READ from DIMMA, Group A (single rank) | No term | No term | 25 ohm | No term |
| READ from DIMMA, Group B (dual rank) | 45 ohm | No term | 25 ohm | No term |
| READ from DIMMB, Group A (single rank) | 25 ohm | No term | No term | No term |
| READ from DIMMB, Group B (dual rank) | 25 ohm | No term | 45 ohm | No term |

FIG. 4

| | ODT of DIMMA, Group A | ODT of DIMMA, Group B | ODT of DIMMB, Group C | ODT of DIMMB, Group D |
|---|---|---|---|---|
| WRITE to DIMMA, Group A | 80 ohm | No term | 15 ohm | No term |
| WRITE to DIMMA, Group B | No term | 80 ohm | 15 ohm | No term |
| WRITE to DIMMB, Group C | 15 ohm | No term | No term | 50 ohm |
| WRITE to DIMMB, Group D | 15 ohm | No term | 30 ohm | 80 ohm |
| READ from DIMMA, Group A | No term | No term | 30 ohm | No term |
| READ from DIMMA, Group B | No term | No term | 30 ohm | No term |
| READ from DIMMB, Group C | 15 ohm | No term | No term | 40 ohm |
| READ from DIMMB, Group D | 15 ohm | No term | No term | No term |

FIG. 6

MEMORY RANK AND ODT CONFIGURATION IN A MEMORY SYSTEM

BACKGROUND

Memory systems can include a number of memory modules that are connected to a common transmission channel. The number of memory modules has an impact on the signal integrity of the transmission channel due to factors such as the loading on the transmission channel and increased signal reflections, which in turn limits the data rate of the transmission channel. For example, a memory system with two dual-rank modules connected to the same transmission channel may be able to reach a data rate of 1000 Mbps, whereas a memory system with three dual-rank modules connected to the same transmission channel may be limited to a data rate of 800 Mbps. As a result, increasing the capacity of a memory system by increasing the number of memory modules connected to the same transmission channel comes at the expense of reduced data rates.

BRIEF DESCRIPTION OF THE DRAWINGS

The teachings of the embodiments herein can be readily understood by considering the following detailed description in conjunction with the accompanying drawings.

Figure (FIG. 1 is schematic illustration of a memory system, according to one embodiment.

FIG. 4 is a table of ODT settings for the memory system of FIG. 1, according to an embodiment.

FIG. 6 is a table of ODT settings for the memory system of FIG. 5, according to an embodiment.

DETAILED DESCRIPTION OF EMBODIMENTS

Embodiments of the present disclosure relate to a memory system where memory capacity may be increased without impacting data rates. In one embodiment a memory system includes two memory modules and a memory controller. The first memory module includes at least a first memory package corresponding to a first number of memory ranks (e.g. one memory rank) and a second memory package corresponding to a second number of memory ranks (e.g. two memory ranks) that is greater than the first number of memory ranks. The second memory module includes at least a third memory package corresponding to the first number of memory ranks (e.g. one memory rank) and a fourth memory package corresponding to the second number of memory ranks (e.g. two memory ranks).

For each module, the memory packages may be asymmetrically staggered such that one memory package is further from the memory controller than the other memory package. Other embodiments may include memory modules that have a different number of memory ranks, such as one module with two memory ranks and another module with four memory ranks.

The memory controller is coupled to the memory packages via a common data line and generates control information for controlling the on-die termination (ODT) of the memory packages. Through control of the ODT settings, the memory system can have increased storage capacity while still operating at a high data rate.

Reference will now be made in detail to several embodiments of the present disclosure, examples of which are illustrated in the accompanying figures. It is noted that wherever practicable similar or like reference numbers may be used in the figures and may indicate similar or like functionality. The figures depict embodiments of the present disclosure for purposes of illustration only. One skilled in the art will readily recognize from the following description that alternative embodiments of the structures and methods illustrated herein may be employed without departing from the principles, or benefits touted, of the disclosure described herein.

Figure 1:
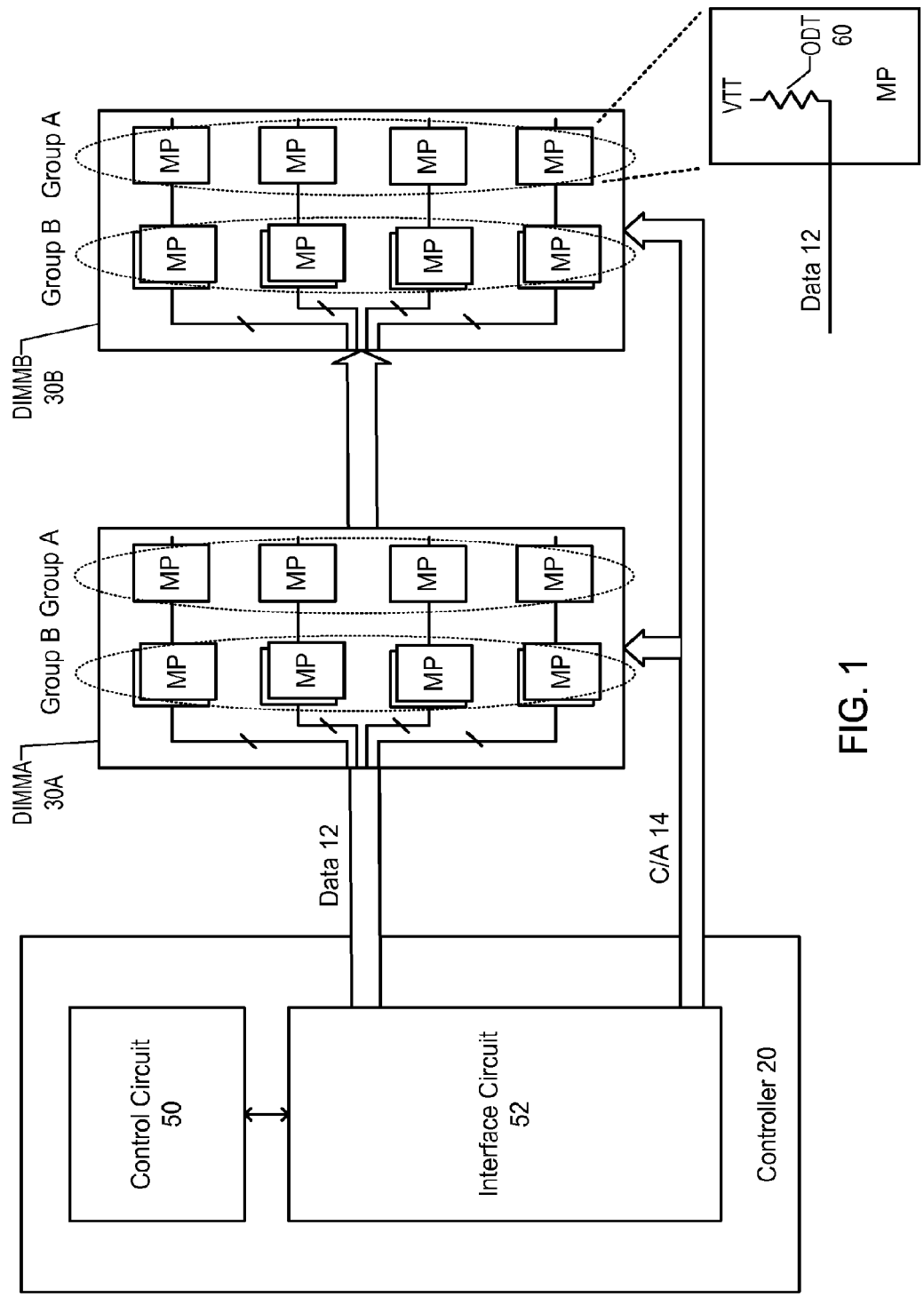

FIG. 1 is schematic illustration of a memory system 10, according to one embodiment. The memory system 10 includes a memory controller 20 and two dual inline memory modules (DIMMs) 30 interconnected via a data channel 12 and a command and address (C/A) channel 14. The DIMMs 30 are in a multi-drop configuration where DIMMA 30A is positioned closer to the memory controller 20 than DIMMB 30B.

Each memory DIMM 30 includes several memory device packages MP that store and output data under the control of the memory controller 20. The memory device packages MP are organized into two different memory groups that represent three memory ranks. A memory rank may refer to a set of memory connected to the same chip select signal that can be accessed simultaneously. In one embodiment, a memory rank may be 64 bits wide.

Memory group A represents a single rank of memory. Each memory package MP in memory group A may include a single memory die. Memory group B represents two ranks of memory and each memory package MP in group B is a part of both ranks of memory. Each memory package MP may include two memory dies that can be addressed independently of each other with different chip select signals to provide dual-rank functionality. For example, the memory packages MP in memory group B may include stacked memory dies. In one embodiment, the memory packages MP include dynamic random access memory (DRAM) or other types of memory.

Memory group A and memory group B are positioned asymmetrically on each DIMM 30. That is, memory group B is closer to the memory controller 20 than memory group A. As a result, for each DIMM 30, the average length of the data channel 12 between the memory controller 20 and the group A memory packages MP is substantially longer than the average length of the data channel 12 between the memory controller 20 and the group B memory packages MP.

Each memory package MP also has on-die termination (ODT) 60 coupled between the data channel 12 and a termination voltage (VTT). The ODT may include several different resistors that are configurable to present a proper equivalent impedance to the data channel 12, which minimizes signal integrity issues such as signal reflections. For each memory group, the value of the ODT is set in accordance with control information received from the memory controller 20. Additionally, the ODT for each memory group can be set independently of the ODT for the other memory groups.

Simulation results show that the asymmetric placement of memory groups combined with precise control of the ODT settings across the different memory groups in the two triple-rank DIMMS 30 of FIG. 1 results in a memory system 10 that has better signal integrity than memory systems using three dual-rank DIMMs. The improved signal integrity allows the memory system 10 to have a fast data rate that is comparable to lower capacity memory systems that use only two dual-rank DIMMs 10. Thus, the disclosed memory system 10 with two triple-rank DIMMs 30 is able to increase storage capacity without sacrificing on performance.

In some embodiments, the DIMMs 30 may represent any type of DIMMs, such as a small outline DIMMs (SO-DIMMs), unbuffered DIMMs, or buffered DIMMs. Additionally, in FIG. 1, each rank of memory includes four memory packages MP. In other embodiments, each rank of memory may include a different number of memory packages MP, such as eight or more memory packages MP.

The data channel 12 includes multiple signal lines for carrying data signals (DQ) and data strobe (DQS) signals between the memory controller 20 and the memory packages MP. The C/A channel 14 includes multiple signal lines for carrying C/A signals such as address signals (ADDR), chip select signals (CS), clock signals (CLK), ODT signals, as well as other types of control signals to the memory packages MP.

In one embodiment, the memory controller 20 is an integrated circuit (IC) chip that controls the operation of the memory system 10. Examples of a memory controller 20 include a central processing unit (CPU), a graphics processing unit (GPU), a system on chip (SoC), etc. Memory controller 20 includes a control circuit section 50 and an interface circuit 52. The control circuit 50 generates ODT control information for setting the ODT values of the memory packages MP, in addition to other general control information and memory commands. The settings for the ODT values can vary depending on whether data is being read from or written to the DIMMs. The ODT settings can also vary depending on which memory group is being accessed. The ODT settings are explained in greater detail in conjunction with FIG. 4.

The interface circuit 52 receives the ODT control information from the control circuit 50 and transmits the ODT control information to the memory packages MP 30 via the C/A channel 14. In one embodiment, setting the ODT values is a two step process. During initialization, the memory controller 20 transmits a mode register command that configures the possible resistance values (e.g. 25 ohm, 45 ohm, unterminated) that the ODT can be set to during future memory operations. Setting the resistance values to unterminated effectively disables the ODT. This information can be stored within mode registers (not shown) inside the MPs. During memory access operations, the memory controller 20 toggles one or more ODT control signals within the C/A channel 14 that selects one of the possible resistance values, as indicated by the mode register setting. Each memory group may be controlled by its own set of ODT control signals so the ODT settings for different memory groups are independent of each other.

Figure 2:
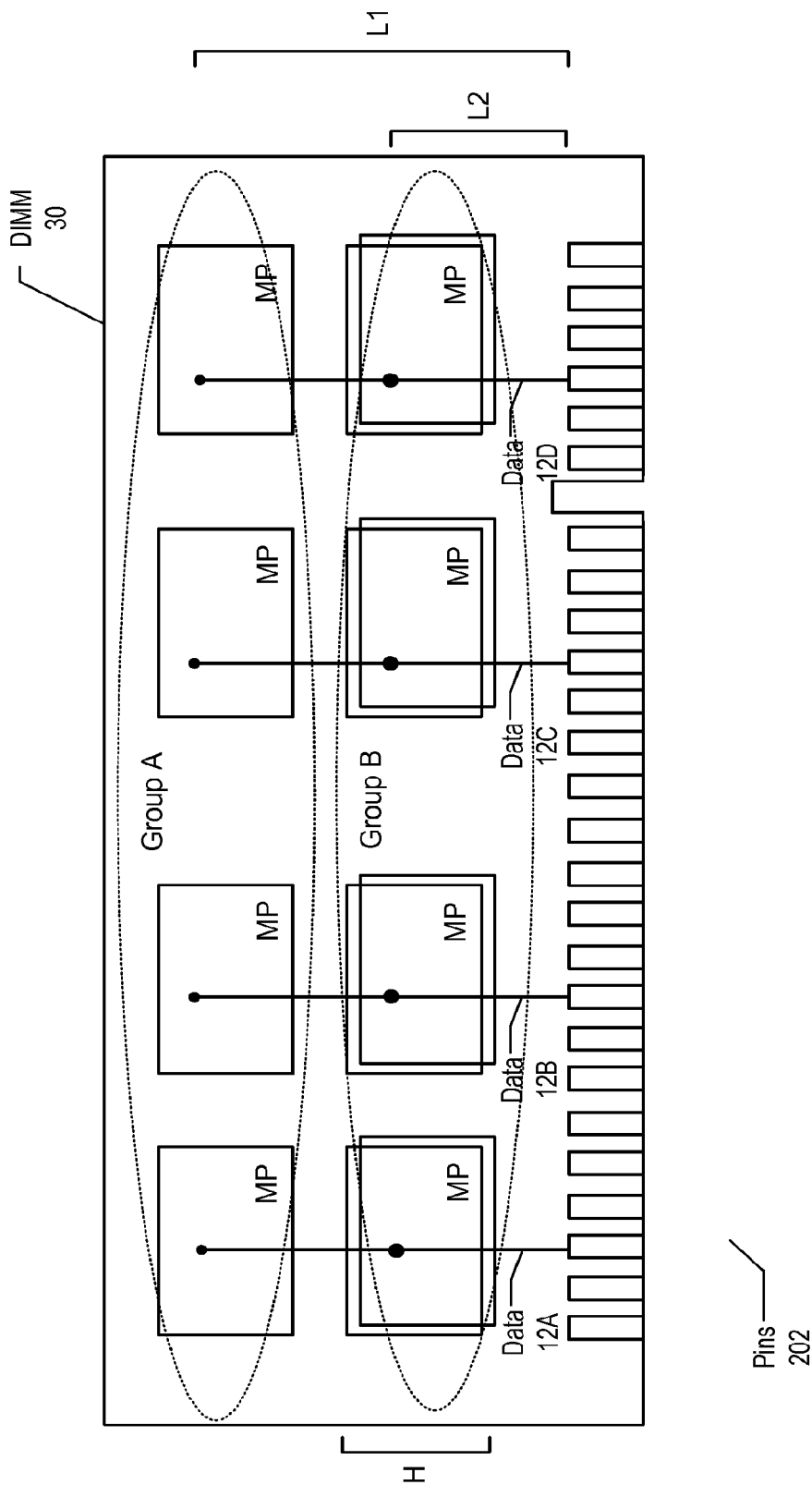
FIG. 2 is a more detailed view of a DIMM from FIG. 1, according to an embodiment.

FIG. 2 is a more detailed view of a DIMM 30, according to an embodiment. The DIMM 30 is suitable for use as DIMMA 30A or DIMMB 30B from FIG. 1. The DIMM 30 includes a row of connector pins 202 at the bottom edge of the DIMM 30 through which the MPs can communicate with the memory controller 20. The connector pins 202 may include pins for the data channel 12, pins for the C/A channel 14, and pins for power and ground.

The portion of the data channel 12 on the DIMM is comprised of individual signaling lines (e.g., 12A-12D) that connect the memory packages MP to the connector pins 202. The signaling lines may be metal traces or other types of electrically conductive structures that create a path for carrying electrical signals to the memory packages MP. For ease of illustration, each MP is shown as being coupled to only a single data signaling line (e.g., 12A, 12B, 12C or 12D). In practice, there may be multiple (e.g. sixteen) data signaling lines 12A-12D connected to each MP.

Each data signaling line 12A-12D is coupled to and shared between two memory packages MP: one memory package MP in group A and another memory package MP in group B. L1 represents the approximate length of the data signaling lines 12A-12D between the connector pins 202 and the memory packages MP of memory group A. L2 represents the approximate length of the data signaling lines 12A-12D between the connector pins 202 and the memory packages MP of memory group B. Due to the asymmetric placement of the memory groups, L1 is substantially greater than L2. When the data channel 12 is viewed as a whole, the average length of the data channel 12 to memory group A is substantially longer than the average length of the data channel 12 to memory group B. Simulation results have generally shown that, to achieve satisfactory signal integrity and data rates, L1 should be greater than L2 by at least 10% of the height H of the memory package MP. Thus, in one embodiment, L1 is substantially greater than L2 if it exceeds L2 by at least 10% of a height H of a memory package MP. For example, if MP is 10 mm tall, L1 should be greater than L2 by at least 1 mm.

In FIG. 2, both memory groups are located on the same side of the DIMM 30. In other embodiments, the memory groups may be on opposite sides of the DIMM 30. For example, memory group A may be attached to the back side of the DIMM 30 while memory group B may be attached to the front side of the DIMM 30. The memory groups on opposite DIMM sides may also be partially overlapping to create an asymmetric clamshell-like configuration that reduces the height of the DIMM 30 while still maintaining the benefits of the asymmetric configuration.

Figure 3:
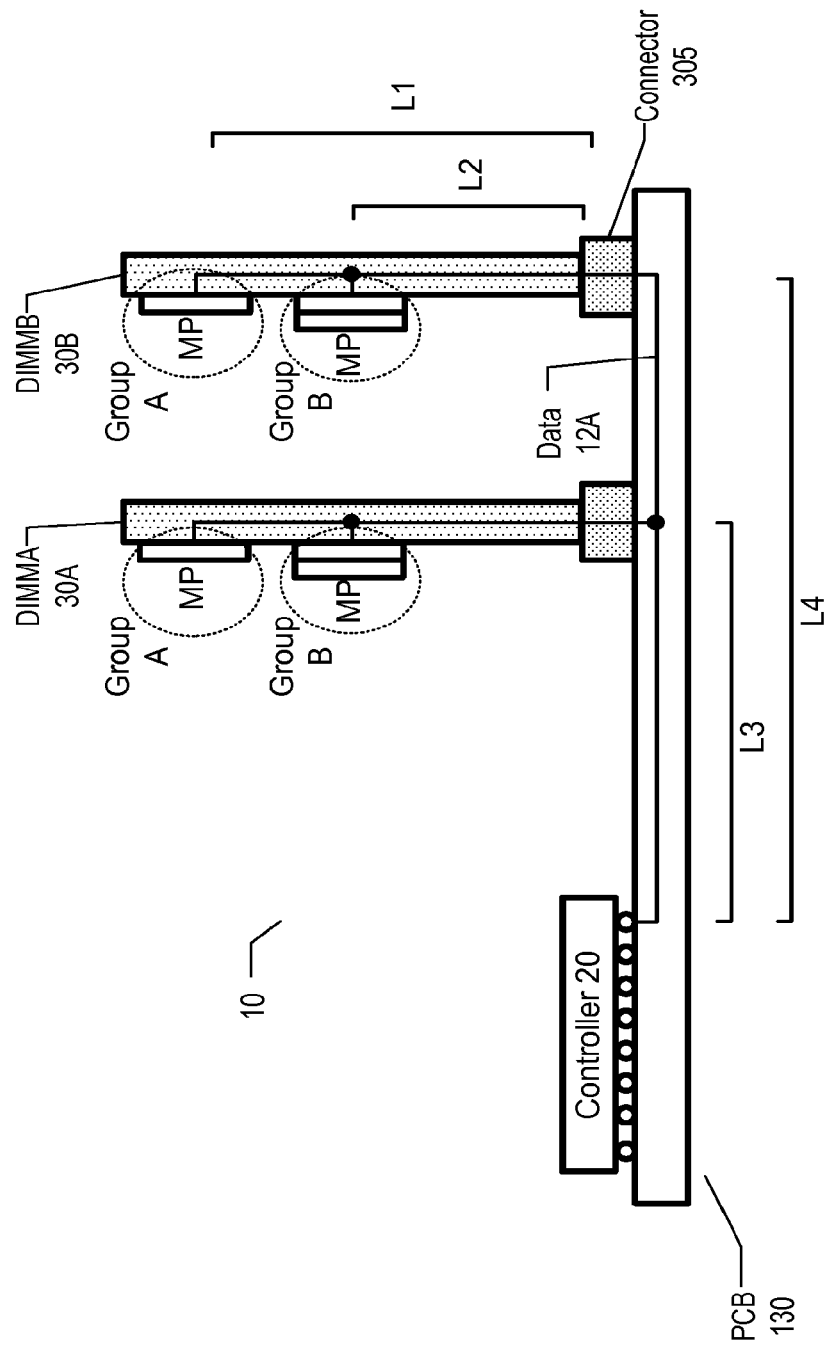
FIG. 3 is cross-sectional view of the memory system from FIG. 1, according to an embodiment.

FIG. 3 is cross-sectional view of a memory system 10, according to an embodiment. The memory controller 20 is coupled to a printed circuit board (PCB) 130, for example, through an integrated circuit socket or by being directly soldered to the PCB 130. The DIMMs 30 are coupled to the PCB 130 through DIMM connectors 305.

Only one data signaling line 12A of the data channel 12 is shown in FIG. 3. The data signaling line 12A includes a portion that is routed through the PCB and other portions that are routed across the DIMMs 30. L3 represents the length of the signaling line 12A between the memory controller 20 and DIMMA 30A. L4 represents the length of the signaling line 12A between the memory controller 20 and DIMMB 30B. L4 is greater than L3 due to the staggered configuration of the DIMMs 30.

For DIMMA 30A, the total length of the data signaling line 12A to memory group A (L3+L1) is substantially greater than the total length of the data signaling line 12A to memory group B (L3+L2). Similarly, for DIMMB 30B, the total length of the data signaling line 12A to memory group A (L4+L1) is substantially greater than the total length of the data signaling line 12A to memory group B (L4+L2). When the signals of the data channel 12 are viewed as a whole, for each DIMM, the average length of the data channel 12 to memory group A is substantially greater than the average length of the data channel 12 to memory group B.

The shape of the data signal line 12A includes signal stubs that can create signal reflections if the impedance throughout the signal line 12A is not properly matched. For example, when writing to the memory packages MP of DIMMA, the portion of the signal line 12A that is routed on DIMMB is a signal stub that can cause signal reflections. As another example, when reading from group B of DIMMA, the portion of the signal line 12A extending from DIMMA group B to DIMMA group A forms another signal stub that can create signal reflections. These signal integrity issues are addressed through independent control of the ODT across the memory groups, which are explained in conjunction with FIG. 4.

FIG. 4 is a table illustrating ODT settings for the memory system 10 of FIG. 1, according to an embodiment. Three different ODT settings are possible for each memory group: no termination (i.e., a high impedance, indicated as "No term" in FIG. 4), a smaller impedance of 25 ohms, and a larger impedance of 45 ohms. The ODT is considered disabled if set to a no termination state and enabled when set to an impedance such as 25 or 45 ohms. As used herein, the active DIMM refers to the DIMM being accessed during the memory access operation, either for reading data or writing data. The idle DIMM refers to the DIMM that is not being accessed during the memory access operation.

During both read and write operation to the active DIMM, the idle DIMM is configured so that the ODT of group A of the idle DIMM is enabled while the ODT of group B of the idle DIMM is disabled. Terminating the furthest memory group of the idle DIMM minimizes signal reflections that would otherwise be caused by the signal stub of the idle DIMM. Specifically, during write operations to DIMMA, the ODT of DIMMB group A is set to 25 ohms and DIMMB group B is not terminated. During write operations to DIMMB, the ODT of DIMMA group A is set to 25 ohms and DIMMA group B is not terminated. During read operations from DIMMA, the ODT of DIMMB group A is set to 25 ohms and DIMMB group B is not terminated. During read operations from DIMMB, the ODT of DIMMA group A is set to 25 ohms and DIMMA group B is not terminated.

During write operations, for the active DIMM, the termination of the group being written to is disabled and the termination of the other group is enabled. Terminating the memory group that is not being written to mitigates signal reflections that can be caused, for example, by the parasitic input capacitance associated with the memory groups. Specifically, when writing to DIMMA group A, DIMMA group A is unterminated and the ODT of DIMMA group B is set to forty five ohms. When writing to DIMMA group B, DIMMA group B is unterminated and the ODT of DIMMA group A set to forty five ohms. When writing to DIMMB group A, DIMMB group A is unterminated and the ODT of DIMMB group B is set to forty five ohms. When writing to DIMMB group B, DIMMB group B is unterminated and the ODT of DIMMB group A set to forty five ohms.

During read operations from group B of the active DIMM, the ODT on the active DIMM for group A is set to 45 ohms and group B of the active DIMM is left unterminated. Activating the termination on group A prevents reflections that would otherwise be caused by the signals read out from group B. During read operations from group A of the active DIMM, the ODT for both groups of the active DIMM is unterminated.

Beneficially, simulation testing on an impedance model of the data channel 12 and memory packages MP have shown that these ODT settings, when used in combination with two triple rank memory DIMMs, maintains good signal integrity at high data rates. These particular ODT settings shown in FIG. 4 are merely examples of possible ODT settings that have been selected based one particular channel 12 configuration. In other embodiments, the ODT values may have different impedances depending on factors such as the target data rate and trace impedance.

Figure 5:
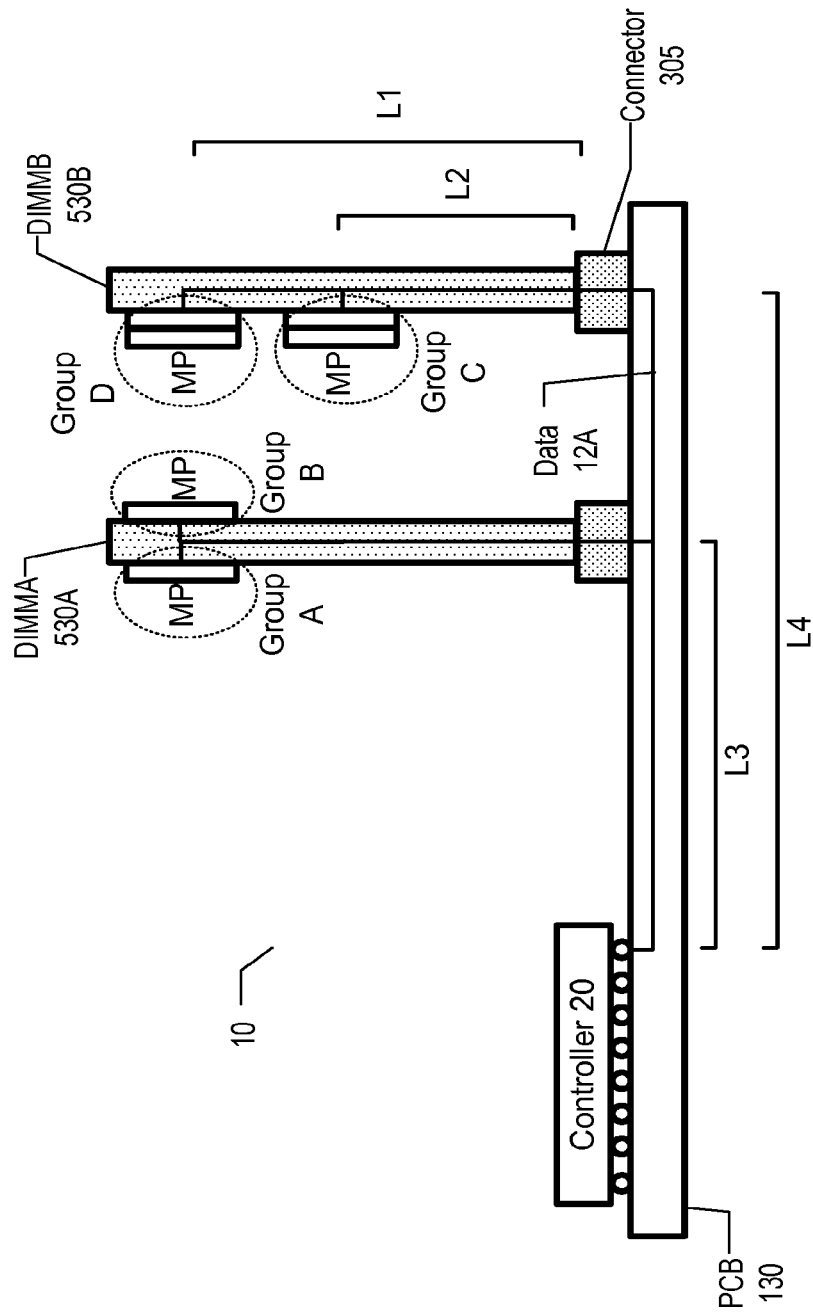
FIG. 5 is cross-sectional view of a memory system, according to another embodiment.

FIG. 5 is cross-sectional view of a memory system 10, according to another embodiment. The memory system 10 of FIG. 5 is similar to the memory system of FIG. 3, but now includes different DIMMs 530A and 530B.

DIMMA 530A is a dual-rank memory module. DIMMA 530A includes two groups of memory packages MP, group A and group B. Group A and group B each represent a single rank of memory. Group A and group B are located on opposite sides of the DIMMA 530A in a clamshell configuration. Because group A and group B are symmetric, the length of the data signaling line 12A to the group A memory package MP is substantially equal to the length of the data signaling line 12 A to the group B memory package MP.

DIMMB 530B is a quad-rank memory module. DIMMB 530B includes two groups of memory packages MP, group C and group D. Group C represents two memory ranks, and group D represents another two memory ranks. Each of the memory packages MP in group C and group D spans two memory ranks.

L1 represents the approximate length of the data signaling line 12A between the connector 305 and a memory package MP of memory group C. L2 represents the approximate length of the data signaling line 12A between the connector 305 and a memory package MP of memory group D. Due to the asymmetric placement of the memory groups, L1 is substantially greater than L2. The total length of the data signaling line 12A to memory group D (L4+L1) is substantially greater than the total length of the data signaling line 12A to memory group C (L4+L2). When the data channel 12 is viewed as a whole, the average length of the data channel 12 to memory group C is substantially greater than the average length of the data channel 12 to memory group D.

FIG. 6 is a table illustrating ODT settings for the memory system 10 of FIG. 5, according to an embodiment. During write operations to DIMMB, group C is always unterminated and group D is terminated, regardless of whether the write operation is to group C or group D. Simulation results have shown that terminating group D instead of group C results in better signal integrity, which can be attributed in part to group D having a large input capacitance (e.g. twice as much as group A). Specifically, when writing to group C, the ODT for group D is set to 50 ohms. When writing to group D, the ODT for group D is set to 80 ohms. Group C and group D have different termination values because group C and group D are in different locations of the data channel 12. Also, during write operations to DIMMB, the ODT for group A of DIMMA is set to 15 ohms and group B of DIMM A is unterminated.

During write operations to DIMMA, the ODT of the group being written to is set to 80 ohms and the other group is left unterminated. Additionally, the ODT of DIMMB group C is set to 15 ohms and group D is left unterminated.

During read operations from DIMMB group C, the ODT of DIMMB group D is set to 40 ohms and DIMMB group C is left unterminated. Terminating DIMMB group D, which is further from the memory controller 20, minimizes signal reflections that would otherwise be caused by DIMMB group D. Also, during read operations from DIMM B, the ODT for DIMMA group A is set to 15 ohms and DIMMA group B is unterminated. During read operations from DIMMA, DIMMA is left unterminated. The ODT for DIMMB group C is set to 30 ohms and DIMMB group D is left unterminated.

Embodiments disclosed herein include both triple rank DIMM configurations as well as dual-rank/quad-rank DIMM configurations. Both configurations have fewer signal stubs than triple DIMM systems without losing storage capacity by placing more memory ranks on a DIMM. The effect of remaining signal stubs and varying input capacitances across the memory system 10 is addressed by asymmetrically locating the memory packages MP and tightly controlling the ODT values across the different DIMMs. As a result, the memory system 10 has a high storage capacity while still operating at a high data rate.

Upon reading this disclosure, those of skill in the art may appreciate still additional alternative designs for ODT and rank configuration in a memory system. Thus, while particular embodiments and applications of the present disclosure have been illustrated and described, it is to be understood that the disclosure is not limited to the precise construction and components disclosed herein. Various modifications, changes and variations which may be apparent to those skilled in the art may be made in the arrangement, operation and details of the method and apparatus of the present disclosure herein without departing from the spirit and scope of the disclosure as defined in the appended claims.

What is claimed is:

1. A memory module, comprising:
   a data line;
   a connector pin coupled to the data line;
   a first memory package coupled to the data line, the first memory package corresponding to a first number of memory ranks; and
   a second memory package coupled to the data line, the second memory package corresponding to a second number of memory ranks that is different than the first number of memory ranks,
   wherein a length of the data line from the connector pin to the first memory package is substantially greater than a length of the data line from the connector pin to the second memory package.

2. The memory module of claim 1, wherein the length of the data line from the connector pin to the first memory package is greater than the length of the data line from the connector pin to the second memory package by at least ten percent of a height of the second memory package.

3. The memory module of claim 1, wherein the first memory package and the second memory package are on a same side of the memory module.

4. The memory module of claim 1, wherein the first memory package and the second memory package are on opposing sides of the memory module.

5. The memory module of claim 1, wherein the first number of memory ranks is one memory rank and the second number of memory ranks is two memory ranks.

6. The memory module of claim 1, wherein on-die termination (ODT) of the first memory package is disabled and ODT of the second memory package is enabled for write operations to the first memory package.

7. A memory system, comprising:
   a first memory module that includes a first memory package corresponding to a first number of memory ranks and a second memory package corresponding to a second number of memory ranks that is different than the first number of memory ranks; and
   a memory controller coupled to the first memory package and second memory package via a common data line,
   wherein a length of the data line from the memory controller to the first memory package is substantially greater than a length of the data line from the memory controller to the second memory package.

8. The memory system of claim 7, wherein the first number of memory ranks is a single memory rank and the second number of memory ranks is two memory ranks.

9. The memory system of claim 7, wherein the memory controller disables on-die termination (ODT) of the first memory package and enables ODT of the second memory package for write operations to the first memory package.

10. The memory system of claim 7, wherein the memory controller enables on-die termination (ODT) of the first memory package and disables the ODT of the second memory package for write operations to the second memory package.

11. The memory system of claim 7, wherein the memory controller enables the on-die termination (ODT) of the first memory package and disables the ODT of the second memory package for read operations from the second memory package.

12. The memory system of claim 7, further comprising:
    a second memory module that includes a third memory package corresponding to the first number of memory ranks and a fourth memory package corresponding to the second number of memory ranks,
    wherein the memory controller transfers data with the third memory package and the fourth memory package via the common data line.

13. The memory system of claim 12, wherein a third length of the data line between the memory controller and the third memory package is substantially greater than a fourth length of the data line between the memory controller and the fourth memory package.

14. The memory system of claim 12, wherein the second memory module is positioned further from the memory controller than the first memory module.

15. The memory system of claim 12, wherein the memory controller enables the on-die termination (ODT) of the first memory package and disables the ODT of the second memory package for both read and write operations to the third memory package and the fourth memory package of the second memory module.

16. The memory module of claim 1, wherein the second number of memory ranks is greater than the first number of memory ranks.

17. The memory system of claim 7, wherein the second number of memory ranks is greater than the first number of memory ranks.

* * * * *